United States Patent
Ueda et al.

(10) Patent No.: US 6,717,048 B2
(45) Date of Patent: Apr. 6, 2004

(54) ELECTROMAGNETIC SHIELDING PLATE AND METHOD FOR PRODUCING THE SAME

(75) Inventors: Kayoko Ueda, Niihama (JP); Hisanori Yamane, Niihama (JP); Yasuhiko Kondo, Kobe (JP); Makoto Sugiya, Kobe (JP)

(73) Assignees: Sumitomo Chemical Company, Limited, Osaka (JP); Sumitomo Rubber Industries, Ltd., Hyogo (JP)

( * ) Notice: Subject to any disclaimer, the term of this patent is extended or adjusted under 35 U.S.C. 154(b) by 19 days.

(21) Appl. No.: 10/093,036

(22) Filed: Mar. 8, 2002

(65) Prior Publication Data

US 2002/0170730 A1 Nov. 21, 2002

(30) Foreign Application Priority Data

Mar. 8, 2001 (JP) ........................... 2001-064619

(51) Int. Cl.⁷ .................................. H05K 9/00
(52) U.S. Cl. .................. 174/35 MS; 348/819
(58) Field of Search ............ 174/35 MS, 35 R, 174/35 GC; 361/816, 818, 799, 800; 348/819, 820; 428/457

(56) References Cited

U.S. PATENT DOCUMENTS

| | | | | |
|---|---|---|---|---|
| 4,715,892 A | * | 12/1987 | Mahulikar | 75/233 |
| 4,978,812 A | * | 12/1990 | Akeyoshi et al. | 174/35 MS |
| 5,076,841 A | * | 12/1991 | Chen et al. | 106/1.25 |
| 6,030,708 A | * | 2/2000 | Ishibashi et al. | 428/441 |
| 6,198,618 B1 | | 3/2001 | Ohtani et al. | |
| 6,399,879 B1 | * | 6/2002 | Ueda et al. | 174/35 MS |
| 6,448,492 B1 | * | 9/2002 | Okada et al. | 174/35 MS |

FOREIGN PATENT DOCUMENTS

| | | |
|---|---|---|
| EP | 0 949 648 A1 | 10/1999 |
| EP | 0 998 182 A2 | 5/2000 |
| JP | 10-64435 A | 3/1998 |
| JP | 11-109888 A | 4/1999 |
| JP | 2001-6435 A | 1/2001 |

* cited by examiner

Primary Examiner—Dean A. Reichard
Assistant Examiner—Carmelo Oliva
(74) Attorney, Agent, or Firm—Sughrue Mion, PLLC

(57) ABSTRACT

An electromagnetic shielding plate having a glass substrate and a geometric pattern formed on the substrate, in which the geometric pattern contains (a) an inorganic filler selected from the group consisting of metals and metal oxides, and (b) a glass component having a softening point of about 200 to 700° C.

14 Claims, 1 Drawing Sheet

ELECTROMAGNETIC SHIELDING PLATE AND METHOD FOR PRODUCING THE SAME

FIELD OF THE INVENTION

The present invention relates to an electromagnetic shielding plate and a method for producing the same

PRIOR ART

An electromagnetic shielding plate is used, for example, as a front filter to be attached to a display, since it can shield electromagnetic waves leaking from the display. The electromagnetic shielding plate used as the front filter should have a property not to decrease the visibility of a display screen of the display in addition to the property to shield the electromagnetic waves. As such an electromagnetic shielding plate, a shielding plate comprising a transparent substrate and a conductive mesh attached to the substrate is known. The conductive mesh is a mesh of conductive fibers knit in a lattice form, and a conductive fiber comprising organic fiber (e.g. polyester fiber, etc.) having a metal thin layer formed on the surface thereof is used.

However, the electromagnetic shielding plate comprising the conductive mesh has a problem that the handling of the mesh is not easy, since the conductive mesh, which is a knit, easily expands and contracts when the plate is produced. Furthermore, the transmittance of visible light of the electromagnetic shielding plate should be increased so that the electromagnetic shielding plate is used as the front filter of the display. To this end, the lattice distance of the conductive mesh is enlarged and also the fiber diameter should be decreased. Such a conductive mesh more easily expands and contracts, so that the handling thereof becomes more difficult. In addition, such a conductive mesh, which easily expands and contracts, has a problem that it tends to suffer from the change of the lattice distance and the deformation of the lattice pattern, when it is adhered to the transparent substrate.

To solve the above problems, it is proposed to adhere an etched sheet of a metal foil, which is etched in a lattice form, to the surface of a transparent substrate. However, when a front filter to be attached to a display having a large area such as a plasma display or a large-size cathode-ray tube (CRT) is produced, a metal foil having a large area comparable to the area of the display should be etched in the lattice form. To etch such a large metal film, a large-scale lithographic process is necessary. Thus, such an electromagnetic shielding plate may not be easily produced.

JP-A-62-57297 and JP-A-02-52499 disclose an electromagnetic shielding plate formed by printing a conductive paint in the form of a lattice or stripes. The electromagnetic shielding plate disclosed in these JP-A publications has a lattice distance of about 1,000 μm and a line width of about 100 μm. Thus, it does not have sufficient electromagnetic shielding properties. In addition, the lattice lines tend to be observable and the visibility of the display may be decreased. Furthermore, the adhesion of the lattice formed from such a conductive paint to a glass substrate is insufficient.

JP-2000-13088A discloses a method for forming a geometric pattern with thin lines on a film using a printing process which allows the printing of a highly fine pattern. However, when such a film is attached to a display as an electromagnetic shielding filter, a step to adhere such a film to a self-supporting plate is necessary in addition to a step to impart low reflection properties and near infrared ray-shielding properties to the film. As a result, the number of steps for the production of the filter increases. In addition, defects such as creasing may appear in handing. Therefore, the handling manner should be reformed. Accordingly, this method needs further improvements. Furthermore, when the geometric pattern is formed on the glass substrate with the currently used paste, the adhesion of the pattern to the substrate is insufficient.

EP-A-0 998 182 discloses an electromagnetic shielding plate on which a fine geometric pattern is formed with a printing method. The adhesion of such a geometric pattern to the glass substrate is also insufficient.

JP-A-10-64435 and JP-A-2001-6435A disclose the addition of glass powder to a paste, which is used to form an internal electrode of a plasma display panel, but they do not disclose the use of glass powder in an electromagnetic shielding plate which requires high visibility and good electromagnetic shielding properties.

The electromagnetic shielding plate is often required to have high shielding properties, when it is used as the front filter of the plasma display panel. In such a case, a metal thin layer is formed on the surface of a pattern by wet plating to increase the conductivity, and thus it is desired to form a pattern which has good plating properties and withstands wet plating. When the electromagnetic shielding plate is used as the front filter of the plasma display panel, it is also desired for the plate to physically protect a module, and to prevent the scattering of fragments, if the module is broken.

SUMMARY OF THE INVENTION

An object of the present invention is to provide an electromagnetic shielding plate comprising a glass substrate and a geometric pattern formed on the substrate, in which the adhesion of the pattern to the glass substrate is good, an additional metal layer can be easily formed on the pattern by wet plating, the pattern is not stripped by the wet plating, and the visibility and strength of the plate is high.

To achieve the above object, the present invention provides an electromagnetic shielding plate comprising a glass substrate, a geometric pattern formed on the substrate and optionally a conductive metal layer formed on the geometric pattern, wherein said geometric pattern comprises (a) an inorganic filler selected from the group consisting of metals and metal oxides, and (b) a glass component having a softening point of about 200 to 700° C.

In addition, the present invention provides a method for producing the electromagnetic shielding plate of the present invention comprising the steps of forming a geometric pattern by printing the pattern with a paste containing an inorganic filler selected from the group consisting of metal powder, metal alloy powder, metal oxide powder, organic metal complexes and organic acid salts of platinum metals, a glass frit, a binder resin and an organic solvent, baking the pattern until the weight of the organic material in the pattern is decreased to 10% or less of the weight of the organic material prior to baking, and optionally forming a conductive metal layer on the geometric pattern by wet plating.

The present invention has been completed based on the finding that an electromagnetic shielding plate having good electromagnetic shielding properties and also high visibility and strength can be easily produced, even if it has a large size, when a geometric pattern is formed on a glass substrate by printing the pattern with a paste containing an inorganic filler selected from the group consisting of metals and metal oxides and a glass frit having a softening point of about 200 to 700° C., baking the pattern, and optionally forming a metal layer on the geometric pattern by wet plating.

DETAILED DESCRIPTION OF THE INVENTION

Figure 1:
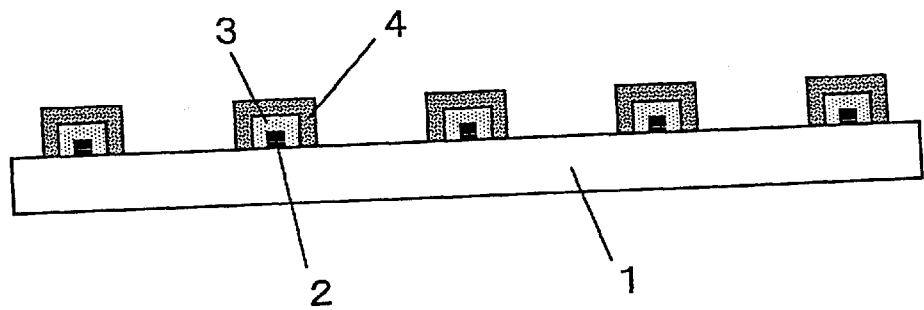
FIG. 1 is a schematic cross sectional view of one embodiment of the geometric pattern formed according to the present invention.

In the electromagnetic shielding plate of the present invention, the geometric pattern (hereinafter referred to as "pattern" simply) is provided on the surface of the glass substrate. The glass substrate is not limited insofar as it has transparency such that the plate can be placed on the front surface of the display. The thickness of the glass substrate is usually from about 0.7 mm to about 5 mm, preferably from about 2 mm to about 3.5 mm, more preferably from about 2.5 mm to about 3 mm. When the thickness of the glass substrate is less than about 0.7 mm, the glass substrate may be easily broken in handling and in use. When the thickness of the glass substrate exceeds about 5 mm, the weight of the glass substrate becomes too large so that the weight of the plate in handling and the total weight of the display equipped with the electromagnetic shielding plate unpreferably increase.

From the viewpoint of preventing the breakage of the plate in handling and in use, the glass substrate is preferably tempered in particular with the increase of the size of the panel. The thickness of the glass substrate is particularly preferably at least about 2 mm from the viewpoint of the easiness of complete tempering. The glass substrate is firstly tempered and then the pattern is formed on the tempered glass substrate, or the pattern is firstly formed on the glass substrate and then the glass substrate having the pattern is tempered. The electromagnetic shielding plate comprising the tempered glass substrate is less broken, and if it is broken, fragments do not scatter.

The tempering of the glass substrate increases the strength of the glass with applying compression strain to the surface of the glass substrate, and it is classified to thermal tempering and chemical tempering depending on the process to apply the compression strain to the surface. The application of compression strain to the surface of the glass substrate can increase the strength of the glass since the fracture of the glass starts from the surface with a tensile force. The thermal tempering may be carried out by heating a glass plate to a temperature around its softening point and then quenching the glass plate with air jet to form a layer having compression strain at the surface of the glass plate. The chemical tempering may be carried out by chemically modifying properties or compositions of the surface layer of the glass plate to form a layer having compression strain at the surface of the glass plate. For example, the chemical tempering includes (1) dealkalinization of the glass surface, (2) surface crystallization, and (3) high or low temperature ion-exchanging. Among them, the low temperature ion-exchanging is most commonly used. The low temperature ion-exchanging comprises replacing alkali ions originally contained in the glass with other alkali ions having a larger ionic radius than that of the originally contained alkali ions in a temperature range lower than the glass transition temperature of the glass. Specifically, a plate of soda glass is dipped in a molten potassium salt to replace the sodium ions in the surface layer of the glass with the potassium ions.

When the glass plate is tempered prior to the formation of the pattern, either the thermal tempering or the chemical tempering may be employed. When the glass plate is tempered after the formation of the pattern, the thermal tempering is employed. In the thermal tempering, the degree of tempering increases when the initial temperature of the glass is closer to the softening temperature and as high as possible, and the cooling rate is larger. The heating and quenching processes in the thermal tempering are carried out by heating the glass substrate to a temperature close to the softening point of the glass in a heating furnace having heating chambers which heat the glass continuously or stepwise and quenching the glass substrate by blowing air jet perpendicular to the both surfaces of the glass substrate with a set of air nozzles, while vertically holding the glass substrate with a metal hanger or maintaining the glass substrate on a mold or a roll.

The glass substrate may be colored with metal ions, metal colloids, non-metallic elements, etc. by conventional methods. In many cases, the glass substrate is colored to improve the visibility of the display. When the electromagnetic shielding plate is used with the plasma display, a property to shield near infrared ray may be imparted to the shielding plate. In such a case, a film having such a property is adhered to the glass substrate, while it is possible to add suitable ions to the glass substrate to impart such a property to the glass. Furthermore, the surface of the glass substrate may be treated with a silane coupling agent, etc. to improve the adhesion between the glass substrate and the conductive pattern which is subsequently formed on the glass substrate. The selection of the silane coupling agent and the treatment of the glass substrate with the silane coupling agent can be done by conventional methods and manners.

The pattern formed on the glass substrate contains at least (a) an inorganic filler selected from the group consisting of metals and metal oxides, and (b) a glass component having a softening point of about 200 to 700° C. The pattern may optionally contain (c) a black pigment, as explained below. Furthermore, a conductive metal layer may be provided on the pattern to increase a conductivity and a dielectric constant and thus to improve the shielding properties.

When no conductive metal layer is provided on the pattern, the metals or metal oxides as the inorganic filler preferably have conductivity to impart the conductivity to the geometric pattern.

Examples of the conductive metals include gold, silver, copper, iron, nickel, aluminum, platinum metals, and alloys comprising at least one of these conductive metals. Stainless steel can be used as an iron alloy. Specific examples of the platinum metal include platinum, ruthenium, rhodium, palladium, osmium and iridium.

Examples of the conductive metal oxides include tin oxide, indium tin oxide (ITO), antimony tin oxide (ATO), etc.

The kind of the metal (or alloys) or the metal oxide to be used may be adequately selected according to the process for forming the pattern, the requisite properties of the pattern, the baking conditions, etc.

When the conductive metal layer is provided on the pattern, the pattern may not necessarily be conductive. Thus, the metals or metal oxides as the inorganic filler may not necessarily be conductive. In such a case, the inorganic filler component may at least one non-conductive metal oxide selected from the group consisting of oxides of gold, silver, copper, iron, nickel, platinum metals, and alloys thereof.

From the viewpoint of increase of the strength of the pattern, the adhesion of the pattern to the glass substrate and printing properties, and also from the viewpoint of costs, the inorganic filler may contain at least one metal or oxide selected from the group consisting of nickel, cobalt, tin, chromium, manganese, and alloys and oxides of these metals, in an amount such that the properties of the patterns such as conductivity, plating properties, etc. are not deteriorated.

The glass component (b) has usually a softening point of about 200 to 700° C., preferably about 350 to 700° C., more preferably from 400 to 620° C. The glass component (b) is suitably selected from conventional glass frits having a softening point in the above range and then baked. Examples of the conventional glass frit include a glass frit with a low softening point in the above range comprising borosilicate glass, such as $PbO—SiO_2—B_2O_3$ glass, $PbO—SiO_2—B_2O_3—ZnO$ glass, $PbO—SiO_2—B_2O_3—Al_2O_3—ZnO$ glass, $B_2O_3—SiO_2—B_2O_3$ glass, $ZnO—SiO_2—B_2O_3$ glass, $R_2O—ZnO—SiO_2—B_2O_3$ glass in which $R_2O$ is an oxide of an alkali metal, and the like.

In the case of electroplating of the pattern formed, the glass frit having a softening point of about 350 to 700° C., preferably about 400 to 620° C. is preferably used. In the case of electroless plating of the pattern formed, the glass frit having a softening point of about 400 to 700° C., preferably about 400 to 620° C. is preferably used.

The amounts of the inorganic filler and the glass frit in the pattern depend on the conductivity to be imparted to the pattern. To form the pattern having a high conductivity, preferably the amount of the glass component is small. From the viewpoint of the adhesion of the pattern to the glass substrate and the strength of the pattern, the content of the glass component is from about 1 to 10% by volume, preferably from about 1 to 5% by volume, more preferably from about 1 to 2.5% by volume, based on the volume of the pattern.

When the metal layer is formed on the pattern, the pattern itself may not necessarily have a high conductivity. When the pattern is directly electroplated, the content of the glass component is from about 1 to 20% by volume, preferably from about 1 to 10% by volume, more preferably from about 3 to 7% by volume. When the pattern is electroless plated, the amount of the glass component is preferably in a range where the exposure of a primer component for plating (e.g. gold, silver, platinum metals or their oxides) is not interfered with, and the content of the glass component is from about 1 to 60% by volume, preferably from about 20 to 50% by volume, more preferably from about 30 to 50% by volume.

When the electromagnetic shielding plate of the present invention is used as the front filter of the display, the whole pattern or the uppermost layer of the pattern is preferably made black to prevent the deterioration of visibility of the display.

When the pattern contains a glossy component such as a metal, a surrounding scene or an image displayed on the display screen is reflected on the surface or the substrate side of the pattern to cause some adverse effects such as the decrease of the contrast of the display. Since the color tone of the components of the pattern is seen on the surface of the glass substrate, the pattern is preferably made black. Thus, the pattern preferably contains (c) a black pigment. Examples of the black pigment (c) include ruthenium, manganese, nickel, chromium, iron, cobalt, copper, and their oxides, and mixtures thereof. When the pattern contains the black pigment, the conductivity of the pattern often decreases. Therefore, the amount of the black pigment should be controlled, or the conductive metal layer is provided on the pattern formed to maintain the conductivity.

To form the geometric pattern comprising the above components on the glass substrate, for example, a paste containing the glass frit and an inorganic filler precursor, which generates the inorganic filler on baking, dispersed in a binder resin and an organic solvent is printed on the glass substrate to form the pattern, and then baked.

The inorganic filler to be used is adequately selected according to the requisite properties of the pattern, the baking conditions, etc. For example, when the paste on the glass substrate is baked in an oxidative atmosphere, for example, in an air, to form the conductive pattern, the inorganic filler may be gold, silver, a platinum metal, an alloy of such a metal, an organic complex or an organic acid salt of a platinum metal, stainless steel, tin oxide, ITO, ATO, etc. When the paste on the glass substrate is baked in a non-oxidative atmosphere, for example, in nitrogen gas, to form the conductive pattern, a metal such as copper, iron, nickel, aluminum, etc. may be used besides the above components. When the pattern may not necessarily be conductive, the oxides of the above metals may be used regardless of the baking atmosphere. When the inorganic filler comprises the platinum metal, the organic metal complex or the organic acid salt of such a metal can be used, since the complex or the salt is decomposed on baking to generate the platinum metal. Here, examples of the organic metal complex include acetylacetonatoplatinum, cis-bis (benzonitrile) dichloroplatinum, acetylacetonatopalladium, bis(benzylideneacetone)palladium, bis(benzonitrile) dichloropalladium, bis[1,2-bis(diphenylphosphino)ethane] palladium, hexafluoroacetyl-acetonatopalladium, etc. Examples of the organic acid salt include palladium acetate, etc.

The paste may further contain the black pigment (c) or a precursor of the black pigment (c).

Examples of the precursor of the black pigment (c) include metals such as ruthenium, manganese, nickel, iron, cobalt or copper; alkoxide derivatives, complexes with β-diketone, complexes with β-keto acid esters, organic carboxylate esters of these metals; etc. They are converted to corresponding oxides on baking to exhibit black color. When the metal as such is used as the precursor of the black pigment (c), it may be different from the metal powder used as the inorganic filler (a), or one metal may have the dual functions. For example, when copper powder is used as the metal powder, a part of the copper powder becomes black copper oxide on baking.

A metal powder consisting of fine silver particles the surfaces of which are very thinly plated with platinum can be used as the inorganic filler, since the platinum-plated silver powder colors black and thus provide the black pattern, and the pattern comprising such a powder has a high conductivity. The thickness of the platinum plating is usually about 1 $\mu$m or less, preferably about 0.3 $\mu$m or less, more preferably about 0.1 $\mu$m or less, from the viewpoint of the conductivity. The conductivity of the pattern increases as the amount of the platinum-plated silver powder in the pattern increases. The content of the platinum-plated silver powder in the pattern is usually at least about 50% by volume, preferably at least about 70% by volume, more preferably at least about 90%, particularly preferably at least about 95% by volume. Although the platinum plating slightly decreases the conductivity, the platinum-plated silver powder colors black since the reflectance of platinum is lower than that of silver. In addition, platinum suffers from less decrease of the conductivity caused by oxidation than other metal, since the surface of platinum is not oxidized on baking in an air. Furthermore, the platinum-plated silver powder does not color the glass on baking, while silver itself colors the glass when it is heated on soda glass at high temperature. Besides platinum, other platinum metal such as palladium may be used to plate the silver powder. When the pattern on the glass substrate is baked in the non-oxidative atmosphere, metal powder to be plated may be copper powder, and nickel may be used to plate such a metal powder.

Examples of the binder resin used in the present invention include polyester resins, epoxy resins, acrylic resins, ethylcellulose resins, butyral resins, urethane resins, etc.

The organic solvent is used to adjust the viscosity of the paste, and any organic solvent that evaporates at a suitable temperature may be used.

The inorganic filler is usually the powder of, for example, the metal described above. From the viewpoint of the dispersibility in the binder resin, a metal powder having a particle size of about 0.1 to 5 $\mu$m or a flake-form metal having a length of about 1 to 20 $\mu$m is preferably used.

The glass frit has a particle size of about 10 $\mu$m or less, preferably about 5 $\mu$m or less from the viewpoint of the dispersibility in the binder resin.

The paste may contain a polymer dispersant (e.g. a polyester dispersant, etc.), a silane coupling agent, a titanate coupling agent, etc. to improve the dispersibility of the components in the binder resin.

The amounts of the components in the paste are adequately determined according to the method for forming the desired geometric pattern, the conductivity of the pattern, the adhesion of the pattern to the glass substrate, etc. When the easiness of printing of the paste is taken into consideration, the content of the binder resin in the paste is usually from about 10 to 90% by volume, preferably from about 20 to 70% by volume, more preferably from about 30 to 65% by volume.

The geometric pattern in the electromagnetic shielding plate of the present invention may be any geometric pattern, for example, triangles such as equilaterial triangles, isosceles triangles, right-angled triangles, etc.; quadrangles such as squares, rectangles, parallelograms, rhombuses, trapeziums, etc.; other polygons such as pentagons, hexagons, octagons, dodecagons, etc.; circles, ellipsoids, trefoils, petals, stars, and the like. Each geometric pattern is composed of one or more of these figures, which are regularly or irregularly arranged.

The pitch of the pattern is preferably from about 50 to 250 mesh in terms of the number of lines in one inch (25.4 mm), or the distance between the adjacent lines (line distance) is from about 500 to 100 $\mu$m. More preferably, the pitch of the pattern is from about 50 to 200 mesh (about 500 to 125 $\mu$m). The width of each line is preferably from about 10 to 80 $\mu$m, more preferably from about 10 to 40 $\mu$m.

When the pitch of the lines is less than 50 mesh, the geometric pattern may become observable so that the visibility of the display screen tends to deteriorate. When the pitch of the lines exceeds about 250 mesh, the geometric pattern becomes too fine so that the transmittance of the visible light decreases and thus the display screen tends to become dark.

When the line width exceeds about 80 $\mu$m, the lattice pattern may become observable so that the visibility of the display screen tends to deteriorate. When the line width is less than about 10 $\mu$m, it becomes difficult to form the geometric pattern. Thus, the line width is usually at least about 10 $\mu$m.

The thickness of the line of the pattern is preferably at least about 1 $\mu$m, and usually does not exceeds about 30 $\mu$m.

When the line thickness is less than about 1 $\mu$m, the effect to shield the electromagnetic waves may be insufficient.

When the brightness (light transmittance) is made equal by the adjustment of the line distance, the line width is preferably decreased to about 40 $\mu$m or less to decrease the line distance, since the effect to shield the electromagnetic waves increases, although the printing of the line having a narrower width is more difficult.

In the case of the pattern other than a square, the line distance is a value obtained by converting the distance to that of the square. Such a converted value can be obtained from the line width and the light transmittance measured.

The pattern is usually formed on one surface of the glass substrate, although the patterns may be formed on the both surfaces of the glass substrate. The pattern of the present invention may be formed directly on a front glass plate which constitutes a module of the plasma display, etc. Thereby, the effect to shield the electromagnetic waves can be imparted to the module itself. To form the pattern of the present invention directly on the front glass plate of the module, preferably, the pattern is formed on one surface of the glass plate prior to the assembling of the module, while a transparent electrode pattern is printed on the other surface of the plate, and then the glass plate is used as the front glass plate, from the viewpoint of a productivity and a yield, although the pattern may be formed directly on the front glass plate of the assembled module.

The pattern may be printed by an offset printing process such as a plate offset printing process, a relief offset printing process, a planography offset printing process, etc.; a screen printing process; a gravure printing process; and the like. Among them, the offset printing process is preferable, since it can form the pattern without the breaking of the lines constituting the pattern, even when the geometric pattern has very thin lines with a width of about 40 $\mu$m or less. Furthermore, the plate offset printing process is preferable since it can easily form the pattern having a large thickness.

After the pattern is formed on the glass substrate, it is baked to decompose almost all the organic materials such as the binder resin to fix the pattern consisting of the inorganic components to the glass substrate. The backing is carried out in an oxidative atmosphere such as an air, in vacuum, or a non-oxidative atmosphere such as a nitrogen atmosphere or a hydrogen atmosphere. When the baking is carried out in an air, a baking temperature is usually from about 350 to 750° C., preferably from about 400 to 750° C., more preferably from about 400 to 700° C. When the baking temperature is less than about 350° C., the amount of the organic materials in the pattern may not be sufficiently decreased, so that the adhesion of the pattern to the glass substrate is insufficient. When the baking temperature exceeds about 750° C., the glass substrate may be largely deformed. To sufficiently adhere the pattern to the glass substrate, the residual amount of the organic materials in the pattern is usually about 10% or less, preferably about 5% or less, more preferably about 1% or less of the weight of the pattern prior to baking.

Baking conditions such as the baking temperature, baking time and baking atmosphere may vary in accordance with other factors such as the geometric pattern to be formed, the composition of the paste used, etc., and is adequately selected according to the other factors.

When the tempered glass substrate is used as the glass substrate on which the pattern is formed, the baking conditions are set less severe than the distortion point of the glass so that the tempering is not annealed. To this end, the baking is carried out at a temperature lower than the distortion point of the glass preferably by at least about 30 degrees (° C.), more preferably by at least about 50 degrees, particularly preferably by at least 100 degrees. When the pattern is formed on a general glass substrate and then baked, it is baked to a temperature close to the softening point of the glass and then it is quenched. Thereby, the glass substrate is tempered at the same time. Concretely, the pattern on the glass substrate is baked at a temperature of about 600 to 710° C. for 30 seconds to 15 minutes, preferably at a temperature of about 680 to 710° C. for about 80 to 160 seconds, more preferably for about 100 to 140 seconds, and then the pattern is quenched by blowing an air.

The tempering conditions are adequately determined according to the thickness of the glass substrate, a desired degree of tempering, etc.

The electromagnetic wave can be effectively shielded by the formation of the pattern containing the inorganic filler and the glass component on the glass substrate as described above. To further increase the shielding effect, the conductive metal layer is preferably formed on the pattern. Examples of the metal used to form the metal layer include copper, nickel, etc. The metal layer may be a single layer or a multilayer having two, three or more sublayers. The thickness of the metal layer is usually from about 0.1 to 20 $\mu$m, preferably from about 0.1 to 5 $\mu$m.

The metal layer may be formed on the pattern by plating the metal on the pattern after the formation of the pattern. As the plating process, wet plating is preferable since the metal layer can be selectively formed on the pattern. The wet plating may be either electroplating or electroless plating, and adequately selected depending on the required conductivity of the pattern. Two plating processes may be employed in combination. When the pattern is conductive, the electroplating can be applied from the beginning. The conductivity of the pattern is insufficient, the first conductive layer having a small thickness is formed by the electroless plating and then the second conductive layer is formed by the electroplating to form the uniform metal layer in a short period of time.

In the case of the electroless plating, the metal is plated after a plating catalyst is applied to the pattern, or the metal is plated directly on the pattern when the pattern contains the plating catalyst.

When the plating catalyst is applied to the pattern, the pattern preferably contains a metal such as copper, iron, silver, gold, a platinum metal, etc. or their alloy or oxide. The inclusion of such a metal, alloy or oxide in the pattern facilitates the absorption of the plating catalyst to the pattern. The absorbed catalyst is activated, and then the pattern is dipped in a plating bath to carry out the electroless plating. In this case, the pattern is formed using the inorganic filler selected from the group consisting of metals such as copper, iron, silver, gold, platinum metals, and alloys and oxides of these metals, and the glass frit having a softening point of about 350 to 700° C. As the content of the inorganic filler in the pattern decreases, the plating properties may deteriorate. Thus, the content of the inorganic filler in the pattern is usually at least about 10% by volume, preferably at least about 20% by volume.

When the pattern contains silver, gold, a platinum metal, or its alloy or oxide, it can be directly electroless plated. In this case, the pattern is formed using the inorganic filler selected from the group consisting of silver, gold, platinum metals, and alloys and oxides of these metals, and the glass frit having a softening point of about 400 to 700° C.

When the platinum metal powder is used, the pattern can be directly electroless plated, if the content of platinum in the pattern is at least 1% by volume although it depends on a specific surface area. The content of platinum in the pattern is usually from about 1 to 10% by volume, preferably from about 2 to 3% by volume. When the organic metal complex such as acetylacetonatoplatinum or the organic acid salt such as palladium acetate is used as the source of platinum metals, the platinum metal formed by baking is effectively dispersed in the pattern and thus the pattern can be uniformly electroless plated. The amount of the organic metal complex or the organic acid salt to be added to the inorganic filler is usually from about 0.01 to 10% by weight, preferably from about 0.1 to 5% by weight, more preferably from about 1 to 3% by weight, from the viewpoint of the plating properties and costs.

In any case, the pattern preferably contains at least one metal or oxide selected from the group consisting of nickel, cobalt, tin, chromium, manganese, and their alloys and oxides in an amount such that the requisite properties of the pattern such as the conductivity are not deteriorated, from the viewpoint of the strength of the pattern, the increased adhesion of the pattern to the glass substrate, and the costs, as described above.

Preferably, nickel powder and/or copper powder are used as the inorganic fillers from the viewpoint of the black coloring of the pattern, the printing properties, and costs. When the small amount of the organic complex of the platinum metal and/or the organic acid salt of the platinum metal is added to the nickel powder and/or copper powder, and the pattern is formed from such a mixture, the pattern is colored black and can be directly electroless plated. Therefore, the conductive metal layer can be easily formed.

The pattern of the present invention is sufficiently resistant to the plating carried out under strongly basic or acidic conditions, and is not removed from the glass plate.

To make the outermost layer of the pattern black, the pattern is treated by black nickel plating, chromate plating, black ternary alloy plating using tin, nickel and copper, or black ternary alloy plating using tin, nickel and molybdenum. Alternatively, the surface of the metal is rendered black by oxidization or sulfurization, which may be carried out by a conventional method.

One embodiment of the geometric pattern, which can be formed as described above, is shown in FIG. 1. FIG. 1 schematically shows the cross section of the pattern. In this embodiment, on the surface of the glass substrate 1, the geometric pattern 2 is formed by printing and baking. The geometric pattern 2 contains the metal and glass components, and optionally a black pigment. On the pattern 2, the metal layer 3 is formed, and then the black layer 4 is formed on the metal layer 3.

A functional film may be laminated on the electromagnetic shielding plate of the present invention. Examples of the functional film include an anti-reflection film which prevents the reflection of light on the film surface, a colored film which is colored with a colorant or an additive, a near IR ray-shielding film which absorbs or reflects near IR ray, an anti-proofing film which prevent the adhesion of dirt such as finger prints, etc.

The electromagnetic shielding plate of the present invention is preferably used as a front filter of a display such as a plasma display panel.

EXAMPLES

The present invention will be illustrated in detail by the following Examples, which do not limit the scope of the present invention in any way.

The electromagnetic shielding plates produced in the Examples were evaluated as follows:

(1) Line width

The width of each line is measured by observing a geometric pattern with a microscope.

(2) Surface resistivity

A surface resistivity is measured by a four-probe method with a surface resistivity meter ("LORESTA" manufactured by Mitsubishi Chemical Corporation).

(3) Electromagnetic shielding property

A square sample (200 mm×200 mm) is cut out from an electromagnetic shielding plate, and the peripheral edges are grounded with a copper tape to obtain a specimen. With this specimen, an intensity of an electromagnetic wave in the frequency range of 1 MHz to 1 GHz is measured with an electromagnetic shielding effect tester ("TR 17301" manufactured by ADVANTEST CORPORATION) and a network analyzer ("8753A" manufactured by Hewlett-Packard), and then an electromagnetic shielding value is calculated according to the following equation and used as a criterion of the electromagnetic shielding property:

Electromagnetic shielding value (dB)=$20 \times \log_{10}(X_0/X)$ in which $X_0$ is an intensity of an electromagnetic wave measured in the absence of an electromagnetic shielding plate, and X is an intensity of an electromagnetic wave measured in the presence of an electromagnetic shielding plate.

(4) Peeling test

An adhesive tape is adhered to the surface of the specimen, and peeled from one end of the tape with maintaining an angle between the tape and the specimen at 90 degrees (90 degree peeling test). Then, the removal of the pattern is checked.

The pastes used for printing patterns in the Examples were as follows:

Paste A:

As metal powders, a flake-form silver powder having an average particle size of 3 μm ("Silcoat" manufactured by Fukuda Metal Foil and Powder Co., Ltd.) (600 parts by weight) and a spherical nickel powder having an average particle size of 0.5 μm (360 parts by weight) were mixed. With the mixture of the metal powders, a polyester resin (manufactured by Sumitomo Rubber Industries, Ltd.) (100 parts by weight) as a binder resin, a glass frit having a softening point of 550° C. ("GF 3550" manufactured by Okuno Chemical Co., Ltd.) (150 parts by weight) and n-butylcarbitol acetate (50 parts by weight) as a solvent were premixed with a planetary mixer and then kneaded with a three-roll mill to uniformly disperse the metal powders in the binder resin. This paste will be referred to as "Paste A".

Paste B:

A paste was prepared in the same manner as in the preparation of Paste A except that an ethylcellulose resin ("ETHOCEL" manufactured by Dow Chemical) (100 parts by weight) was used in place of the polyester resin as a binder resin. This paste will be referred to as "Paste B".

Paste C:

A paste was prepared in the same manner as in the preparation of Paste A except that a glass frit having a softening point of 460° C. (manufactured by FERRO ENAMELS (JAPAN) LIMITED) (40 parts by weight) was used in place of the glass frit "GF 3550" (150 parts by weight). This paste will be referred to as "Paste C".

Paste D:

As metal powders, a flake-form silver powder having an average particle size of 3 μm ("Silcoat" manufactured by Fukuda Metal Foil and Powder Co., Ltd.) (100 parts by weight) and a spherical nickel powder having an average particle size of 0.5 μm (780 parts by weight) were mixed. With the mixture of the metal powders, a polyester resin (manufactured by Sumitomo Rubber Industries, Ltd.) (100 parts by weight) as a binder resin, the same glass frit as one used in the preparation of Paste C having a softening point of 460° C. (300 parts by weight) and n-butylcarbitol acetate (50 parts by weight) as a solvent were premixed with a planetary mixer and then kneaded with a three-roll mill to uniformly disperse the metal powders in the binder resin. This paste will be referred to as "Paste D".

Paste E:

A paste was prepared in the same manner as in the preparation of Paste A except that a glass frit having a softening point of 250° C. (manufactured by ASAHI TECHNO-GLASS CO., Ltd.) was used in place of the glass frit "GF 3550". This paste will be referred to as "Paste E".

Paste F:

A paste was prepared in the same manner as in the preparation of Paste A except that a glass frit having a softening point of 350° C. (manufactured by FERRO ENAMELS (JAPAN) LIMITED) was used in place of the glass frit "GF 3550". This paste will be referred to as "Paste F".

Paste G:

A flake-form copper powder having an average particle size of 2.2 μm (300 parts by weight) and acetylacetonatoplatinum(II) (1 part by weight) as a primer component for plating were mixed. With this mixture, a polyester resin (manufactured by Sumitomo Rubber Industries, Ltd.) (100 parts by weight) as a binder resin, a glass frit having a softening point of 530° C. (manufactured by Okuno Chemical Co., Ltd.) (100 parts by weight) and n-butylcarbitol acetate (50 parts by weight) as a solvent were mixed with a roll disperser to uniformly disperse the metal powder in the binder resin. This paste will be referred to as "Paste G". The weight percentage of each solid component in this Paste and the volume percentage calculated from the weight percentage are as follows:

|  | Parts by weight | % by weight | % by volume |
|---|---|---|---|
| Flake-form copper | 300 | 59.8 | 20.9 |
| Acetylacetonato-platinum (II) | 1 | 0.2 | 0.6 |
| Glass frit (softening point: 530° C.) | 100 | 20.0 | 15.7 |
| Polyester resin | 100 | 20.0 | 62.8 |
| Total | 501 | 100.0 | 100.0 |

Example 1

On a soda-lime glass substrate having a size of 300 mm×400 mm and a thickness of 3 mm, a lattice-form pattern having a line distance of 250 μm and a line width of 27 μm was formed with Paste A by a plate offset printing process.

The glass substrate carrying the printed pattern was baked in an air at 700° C. for 5 minutes, and then quenched by blowing the air. With such treatments, the pattern was firmly adhered to the substrate, and the substrate glass was tempered.

The polyester resin contained in Past A alone was subjected to a thermogravimetry by heating the resin at 700° C.

for 5 minutes. These heating conditions are comparable to the baking conditions above. The polyester resin was burnt out almost completely.

The tempered glass substrate carrying the baked pattern was degreased by dipping it in a 50 g/L solution of a degreasing agent ("ACE CLEAN A-220" manufactured by Okuno Chemical Co., Ltd.) kept at 50° C. for 10 minutes, and then dipped in a 100 ml/L aqueous solution of sulfuric acid for about 30 seconds. Thereafter, the glass substrate was dipped in a 20 ml/L solution of a catalyst for electroless plating ("TMP Activator" manufactured by Okuno Chemical Co., Ltd.) at room temperature for 5 minutes and then in a 150 ml/L solution of a catalyst-reducing agent ("OPC 150 Cryster manufactured by Okuno Chemical Co., Ltd.) at room temperature for 5 minutes. After that, the glass substrate was dipped in an electroless plating liquid having a concentration of 100 ml/L ("OPC 750" manufactured by Okuno Chemical Co., Ltd.) at room temperature for 10 minutes to form a copper layer on the surface of the pattern.

Then, the glass substrate carrying the pattern covered with the copper layer was dipped in a copper-plating liquid (one liter) containing copper sulfate pentahydrate (70 g), sulfuric acid (200 g) and ion-exchange water (up to one liter) at room temperature and electroplated at 0.9 V for 5 minutes. Thereafter, the surface of the plated pattern was made black by anodizing it in a 200 g/L aqueous solution of sodium hydroxide at 55° C. at 0.4 V for 2 minutes using a stainless steel plate as a cathode and the plated pattern as an anode. Thereby, the electromagnetic shielding plate of this Example was obtained.

The results of the evaluations of this electromagnetic shielding plate are shown in Table 1.

The lattice-form pattern formed in this Example had a three-layered structure as shown in FIG. 1.

Example 2

A pattern was formed on a glass substrate by a plate offset printing process, and then the pattern was baked and the glass substrate was tempered in the same manners as in Example 1 except that Paste B was used in place of Paste A. The ethylcellulose resin contained in Paste B alone was subjected to a thermogravimetry by heating the resin at 700° C. for 5 minutes. The ethylcellulose resin was burnt out almost completely.

Thereafter, the substrate carrying the formed pattern was subjected to the electroless plating with copper, the electroplating with copper and anodization in the same manners as those in Example 1 to make the surface of the pattern black.

The results of the evaluations of this electromagnetic shielding plate are shown in Table 1.

Example 3

A pattern was formed on a glass substrate by a plate offset printing process in the same manner as in Example 1 except that Paste C was used in place of Paste A. Then, the pattern was baked at 450° C. for 1 hour. The polyester resin contained in Paste C alone was subjected to a thermogravimetry by heating the resin at 450° C. for 5 minutes. The residual amount of the polyester resin after baking was 5% of the weight of the resin before baking.

Thereafter, the substrate carrying the formed pattern was subjected to the electroless plating with copper, the electroplating with copper and anodization in the same manners as those in Example 1 to make the surface of the pattern black.

The results of the evaluations of this electromagnetic shielding plate are shown in Table 1.

The electromagnetic shielding property of the electromagnetic shielding plate was evaluated. The results are 53 dB at 50 MHz, 53 dB at 100 MHz, and 60 dB at 300 MHz.

Example 4

A pattern was formed on a glass substrate by a plate offset printing process in the same manner as in Example 1 except that Paste D was used in place of Paste A. Then, the pattern was baked at 480° C. for 1 hour. The polyester resin contained in Paste D was the same as that contained in Paste C. Thus, the residual amount of the polyester resin after baking was 5% of the weight of the resin before baking.

Thereafter, the substrate carrying the formed pattern was subjected to the electroless plating with copper, the electroplating with copper and anodization in the same manners as those in Example 1 to make the surface of the pattern black.

The results of the evaluations of this electromagnetic shielding plate are shown in Table 1.

TABLE 1

| Example No. | Line distance (mesh) | Line width ($\mu$m) | Surface resistivity ($\Omega$/square) |
|---|---|---|---|
| Example 1 | 100 | 39 | $2.1 \times 10^{-1}$ |
| Example 2 | 100 | 34 | $2.3 \times 10^{-1}$ |
| Example 3 | 100 | 34 | $1.8 \times 10^{-1}$ |
| Example 4 | 100 | 29 | $4.9 \times 10^{-1}$ |

Example 5

A pattern was formed on a glass substrate by a plate offset printing process in the same manner as in Example 1 except that Paste E was used in place of Paste A. Then, the pattern was baked at 400° C. for 1 hour. The polyester resin contained in Paste E alone was subjected to a thermogravimetry by heating the resin at 400° C. for 1 hour. The residual amount of the polyester resin after baking was 16% of the weight of the resin before baking.

Thereafter, the substrate carrying the formed pattern was subjected to the electroless plating and the electroplating in the same manners as those in Example 1. However, the pattern dropped off from the substrate in the electroplating process since the baking was insufficient.

Example 6

A pattern was formed on a glass substrate by a plate offset printing process in the same manner as in Example 1 except that Paste F was used in place of Paste A. Then, the pattern was baked at 400° C. for 5 hours. The polyester resin contained in Paste F alone was subjected to a thermogravimetry by heating the resin at 400° C. for 5 hours. The residual amount of the polyester resin after baking was 8% of the weight of the resin before baking.

Thereafter, the substrate carrying the formed pattern was subjected to the electroless plating in the same manners as that in Example 1. However, the pattern dropped off from the substrate in the electroless plating process since the softening point of the glass frit was too low in the case of the electroless plating.

Example 7

On a soda-lime-silica glass substrate having a size of 300 mm×400 mm and a thickness of 3 mm, a lattice-form pattern having a line distance of 250 $\mu$m and a line width of 27 $\mu$m was formed with Paste G by a plate offset printing process.

The glass substrate carrying the printed pattern was baked in a glass-tempering furnace at 700° C. for 100 seconds, and then quenched by blowing hot air to temper the glass.

The glass substrate carrying the pattern was degreased by dipping it in a 50 g/L solution of a degreasing agent ("ACE CLEAN A-220" manufactured by Okuno Chemical Co., Ltd.) kept at 50° C. for 10 minutes, and then dipped in a 100 cc/L aqueous solution of sulfuric acid for about 30 seconds. Thereafter, the glass plate was dipped in an electroless plating liquid ("OPC 750" manufactured by Okuno Chemical Co., Ltd.) at 30° C. for 10 minutes to form a copper layer on the surface of the pattern. The plating property of the pattern was good.

Then, the surface of the plated pattern was anodized in a 8N aqueous solution of sodium hydroxide at about 1 V for 2 minutes using a stainless steel plate as a cathode. The pattern after anodization was subjected to the peeling test. No peeling of the pattern was found and thus the adhesion of the pattern to the glass substrate was good.

In the electromagnetic shielding plate of the present invention, the geometric pattern is formed directly on the surface of the glass substrate, and the adhesion of the pattern to the glass substrate is good. In addition, an additional metal layer can be easily formed by wet plating, the pattern is not stripped by the wet plating, and the strength of the plate is high. When the electromagnetic shielding plate of the present invention is used as a front filter of a display, the electromagnetic shielding property and the visibility of the display screen are good. The electromagnetic shielding plate of the present invention can be easily produced even when its size is large.

What is claimed is:

1. An electromagnetic shielding plate comprising a glass substrate and a geometric pattern formed on the substrate, wherein said geometric pattern comprises (a) an inorganic filler selected from the group consisting of metals and metal oxides, and (b) a glass component having a softening point of about 200 to 700° C.

2. The electromagnetic shielding plate according to claim 1, wherein said inorganic filler is said metal, and wherein said metal is selected from the group consisting of gold, silver, copper, iron, nickel, aluminum, platinum metals, and alloys of these metals.

3. The electromagnetic shielding plate according to claim 1, wherein said inorganic filler is said metal oxide, and wherein said metal oxide is selected from the group consisting of tin oxide, indium tin oxide and antimony tin oxide.

4. The electromagnetic shielding plate according to claim 1, wherein said geometric pattern further contains a black pigment.

5. The electromagnetic shielding plate according to claim 4, wherein said black pigment is an oxide of at least one metal selected from the group consisting of ruthenium, manganese, nickel, chromium, iron, cobalt and copper.

6. The electromagnetic shielding plate according to claim 1, wherein said geometric pattern has a line distance of about 50 to 250 mesh, and a line width about 10 to 80 μm.

7. The electromagnetic shielding plate according to claim 1, wherein said glass substrate is a tempered glass substrate.

8. The electromagnetic shielding plate according to claim 1, wherein said inorganic filler is at least one material selected from the group consisting of gold, silver, copper, iron, platinum metals, and alloys and oxides of these metals, and said geometric pattern has a conductive metal layer on a surface of said geometric pattern.

9. The electromagnetic shielding plate according to claim 1, wherein said filler further contains at least one material selected from the group consisting of nickel, cobalt, tin, chromium, manganese, and alloys and oxides of these metals.

10. The electromagnetic shielding plate according to claim 8, wherein an uppermost surface of said metal layer is made black.

11. A front filter for a display comprising the electromagnetic shielding plate according to claim 1.

12. The electromagnetic shielding plate according to claim 1, wherein the whole pattern is black.

13. The electromagnetic shielding plate according to claim 1, wherein said geometric pattern is formed by baking a paste containing an inorganic filler precursor, the glass component and a binder resin, so that the weight of an organic material originated from the binder resin is 10% or less of the weight of the binder resin prior to baking, provided that when the glass component has a softening point of about 200 to 400° C., the amount of the organic material after baking is about 5% or less.

14. The electromagnetic shielding plate according to claim 13, wherein the amount of the organic material after baking is about 1% or less.

* * * * *